US012243762B2

(12) United States Patent
Chiu et al.

(10) Patent No.: US 12,243,762 B2
(45) Date of Patent: Mar. 4, 2025

(54) DOOR LOCKING MECHANISM AND SEMICONDUCTOR CONTAINER USING THE SAME

(71) Applicant: Gudeng Precision Industrial Co., LTD, New Taipei (TW)

(72) Inventors: Ming-Chien Chiu, New Taipei (TW); Yung-Chin Pan, New Taipei (TW); Cheng-En Chung, New Taipei (TW); Chih-Ming Lin, New Taipei (TW); Po-Ting Lee, New Taipei (TW); Wei-Chien Liu, New Taipei (TW); Tzu-Ning Huang, New Taipei (TW)

(73) Assignee: Gudeng Precision Industrial Co., LTD, New Taipei (TW)

( * ) Notice: Subject to any disclaimer, the term of this patent is extended or adjusted under 35 U.S.C. 154(b) by 50 days.

(21) Appl. No.: 18/133,765

(22) Filed: Apr. 12, 2023

(65) Prior Publication Data

US 2023/0386876 A1  Nov. 30, 2023

Related U.S. Application Data

(60) Provisional application No. 63/346,426, filed on May 27, 2022.

(51) Int. Cl.
*H01L 21/673* (2006.01)
*E05B 65/52* (2006.01)
*E05C 9/04* (2006.01)

(52) U.S. Cl.
CPC ...... *H01L 21/67373* (2013.01); *E05B 65/523* (2013.01); *E05C 9/045* (2013.01); *E05C 9/047* (2013.01)

(58) Field of Classification Search
CPC .......... E05B 65/52; E05B 65/523; E05C 9/04; E05C 9/042; E05C 9/045; E05C 9/047;
(Continued)

(56) References Cited

U.S. PATENT DOCUMENTS 7,549,552 B2 * 6/2009 Hasegawa ......... H01L 21/67373
206/710
7,971,723 B1 * 7/2011 Chiu ................. H01L 21/67373
206/711
(Continued)

FOREIGN PATENT DOCUMENTS

JP        2013-38217 A  *  2/2013  ........... H01L 21/673

OTHER PUBLICATIONS

Locking Door (Year: 2013).*

*Primary Examiner* — Bryon P Gehman
(74) *Attorney, Agent, or Firm* — WPAT, PC

(57) ABSTRACT

A door locking mechanism and semiconductor container using the same include door panel, cover, and locking module. The door panel has a first stop structure. The cover and the door panel define an accommodating space for receiving the locking module. The locking module includes rotating member, holding member, and elastic member. The elastic member is disposed on the holding member and has a second stop structure near the first stop structure. The elastic member is disposed between the holding and the rotating member. The elastic member is compressed when a force is applied to the holding member, and the second stop structure detaches from a limitation state with the first stop structure for allowing a rotating operation of the rotating member. The elastic member elastically restores when the force is removed, and the second stop structure returns to the limitation state for limiting the rotating operation.

9 Claims, 13 Drawing Sheets

(58) Field of Classification Search
CPC .. H01L 21/67; H01L 21/673; H01L 21/67373
USPC ........................................................ 206/710
See application file for complete search history.

(56) References Cited

U.S. PATENT DOCUMENTS

| | | | | |
|---|---|---|---|---|
| 8,196,748 | B2 * | 6/2012 | Chiu | ................ H01L 21/67373 |
| | | | | 206/711 |
| 8,857,619 | B1 * | 10/2014 | Yang | ................ H01L 21/67379 |
| | | | | 206/710 |
| 10,784,135 | B2 * | 9/2020 | Tieben | .............. H01L 21/67369 |
| 11,501,990 | B2 * | 11/2022 | Matsutori | ......... H01L 21/67346 |

* cited by examiner

DOOR LOCKING MECHANISM AND SEMICONDUCTOR CONTAINER USING THE SAME

RELATED APPLICATIONS

This application claims priority to U.S. Provisional Patent Application, No. U.S. 63/346,426, by CHIU, et al., titled "DOOR LATCH MECHANISM OF SUBSTRATE POD," filed May 27, 2022, which is hereby incorporated by reference herein in their entirety.

BACKGROUND OF THE INVENTION

Technical Field

The present invention relates to a door locking mechanism. More particularly, the present invention relates to a door locking mechanism and a semiconductor container using the same.

Description of Related Art

With the development of semiconductor technology, the size of semiconductor components such as semiconductor wafers, substrates (PCB boards), and reticles is constantly evolving, and the density of circuit patterns thereon is also getting increased. In the process relating to semiconductor fabrication, any particles or other pollutants attached to the semiconductor component may not only damage the surface of the semiconductor component, but also cause quality issues in different process steps. With the increase in the pattern density, the wavelength of light source used in optical lithography process is getting shorter, and the number of particles and the cleanliness requirement for the environment in the semiconductor manufacturing process are regulated with higher standards.

Under such conditions, it is a very important issue on how to maintain a high degree of cleanliness in the inner space of containers or carriers for transporting or storing semiconductor components. The industry has developed the front opening unified pod (FOUP). The door of the pod is provided with a latch mechanism to lock the door and the pod. A keyhole is provided on the outer side of the door so the key can be inserted in the keyhole for controlling the latch mechanism to perform lock and unlock operations. In such latch mechanism, one or more latches are known to be driven by a turntable, so the latches can be locked or unlocked with the pod.

In the fabricating process or during transporting the pod, the pod will be subject to vibrations by the automatic handling devices or other external forces. When the pod vibrates, the turntable in the latch mechanism will move slightly and even rotate. When the rotation angle of the turntable is small, the key cannot be inserted into the keyhole correctly, and the door of the pod cannot be opened and closed correctly. When the rotation angle of the turntable is significant, the turntable will drive the latch to unlock the pod, causing the door to fall off the pod. This problem not only affects the above-mentioned wafer pod, but also affects reticle containers and substrate carriers having such latching mechanism.

Therefore, how to avoid the problems caused by the accidental rotation of the turntable is an important issue that needed to be solved in the related field.

SUMMARY

In view of the above-mentioned problems, the present invention is to provide a door locking mechanism and semiconductor container using the same. By using stop structures respectively located on the door panel and on the holding member and are in the limitation state, they can limit the movement and the rotation of the rotating member. The unexpected movement and rotation of the rotating member caused by the vibration from the fabricating process or during transporting the container can be prevented, and the problems arisen from the unexpected rotation of the rotating member can be solved.

According to one aspect of the invention, a door locking mechanism for using in a semiconductor container is provided. The door locking mechanism includes a door panel, a cover, and a locking module. The door panel has a first stop structure. The cover is used for assembling with the door panel and defining an accommodating space therewith. The locking module is disposed in the accommodating space and includes a rotating member, a holding member, and an elastic member. The holding member is disposed on the rotating member, and the holding member has a second stop structure corresponding to a location of the first stop structure. The elastic member is disposed between the holding member and the rotating member. The elastic member is elastically compressed when a force is applied to the holding member, and the second stop structure of the holding member detaches from a limitation state with the first stop structure for allowing a rotating operation of the rotating member. The elastic member elastically restores when the force is removed from the holding member, and the second stop structure returns to the limitation state with the first stop structure for limiting the rotating operation of the rotating member.

In one embodiment, the door panel has a lock hole penetrating an upper and a lower surface of the door panel, and the first stop structure is disposed at the periphery of the lock hole.

In another embodiment, the rotating member includes an installation slot for installing the holding member, and the installation slot corresponds to a location of the lock hole.

In yet another embodiment, the holding member includes a main body and an installation part disposed on the main body, the second stop structure connects to an end portion of the main body and protrudes toward the door panel, and the installation part is used for installing the elastic member and protrudes away from the door panel.

In a further embodiment, the rotating member includes an installation slot and a penetrating hole in the installation slot, the main body of the holding member is disposed in the installation slot, a portion of the installation part is installed in the penetrating hole, and the elastic member is disposed between a surface of the main body and an inner bottom surface of the installation slot.

In another embodiment, one end of the installation part has an elastic pin which has a protruded edge, and an outer diameter of the protruded edge is larger than a diameter of the penetrating hole so the elastic pin penetrates through the penetrating hole and is in contact with an outer bottom surface of the installation slot, and therefore the elastic pin is used for installing to and removing from the installation slot.

In yet another embodiment, a latching member connecting to the locking module is provided in the accommodating space, and the rotating member of the locking module controls a locking operation and an unlocking operation of the latching member in relation to the door.

In a further embodiment, the cover further includes a pivot base for coupling with the locking module for allowing a revolving operation of the locking module.

According to another aspect of the invention, a semiconductor container is provided. The semiconductor container includes a container body and a door locking mechanism. The container body has a containing space for containing one or more semiconductor objects and a latching portion disposed in the vicinity of an opening of the containing space. The door locking mechanism is configured to lock with the container body and includes a door panel, a cover, a locking module, and a latching member. The door panel has a first stop structure. The cover is used for assembling with the door panel and defining an accommodating space therewith. The locking module is disposed in the accommodating space and includes a rotating member, a holding member, and an elastic member. The holding member is disposed on the rotating member, and the holding member has a second stop structure corresponding to a location of the first stop structure. The elastic member is disposed between the holding member and the rotating member. The elastic member is elastically compressed when a force is applied to the holding member, and the second stop structure of the holding member detaches from a limitation state with the first stop structure for allowing a rotating operation of the rotating member. The elastic member elastically restores when the force is removed from the holding member, and the second stop structure returns to the limitation state with the first stop structure for limiting the rotating operation of the rotating member. The latching member is disposed in the accommodating space and is connected to the locking module. The locking module controls a locking operation and an unlocking operation of the latching member in relation to the container body and therefore controls the door locking mechanism to close and open the containing space.

According to the disclosure of the embodiments of the invention, the first stop structure protrudes from the surface of the door panel and the second stop structure is located on the holding member. When the force is removed from the holding member, the elastic member elastically restores, and hence the second stop structure is limited by the first stop structure. The rotating operation of the rotating member is limited. When the force is applied to the holding member, the elastic member is elastically compressed, and hence the second stop structure detaches from the limitation state with the first stop structure for allowing the rotating operation of the rotating member. The door locking mechanism and the semiconductor using the same has simple construction, which is cost saving. Also, the position of the rotating member can be retained so the unexpected movement and accidental rotation of the rotating member during fabricating process or transporting the container can be prevented. The problem that the robotic arm cannot correctly open or close the door due to keyhole misalignment can also be eliminated, and the problem of the door falling off the container can further be prevented.

BRIEF DESCRIPTION OF DRAWINGS

The invention can be more fully understood by reading the following detailed description of the embodiment, with reference made to the accompanying drawings as follows.

DETAILED DESCRIPTION

According to the door locking mechanism and semiconductor container using the same of the embodiments of the invention, the semiconductor container can be a wafer container, a reticle pod, a substrate container, or any other containers that can be used to receive semiconductor objects. The door locking mechanism is used for fitting with an opening of the semiconductor container. One of the features of the door locking mechanism is that when a second stop structure of a holding member is in a limitation state with a first stop structure of a door panel, a rotating operation of a rotating member is limited. Thus, the technical problems, such as the door falling off the container or not being able to close and open the door normally, can be solved. On the other hand, when a force is applied to the holding member, an elastic member is elastically compressed, and the second stop structure detaches from the limitation state with the first stop structure for allowing the rotating operation of the rotating member. The key can be aligned correctly and the operation of opening and closing the door can be performed smoothly. The door locking mechanism and the semiconductor container using the same according to the embodiments of the invention will be elaborated in below description with accompanying drawings.

Figure 1:
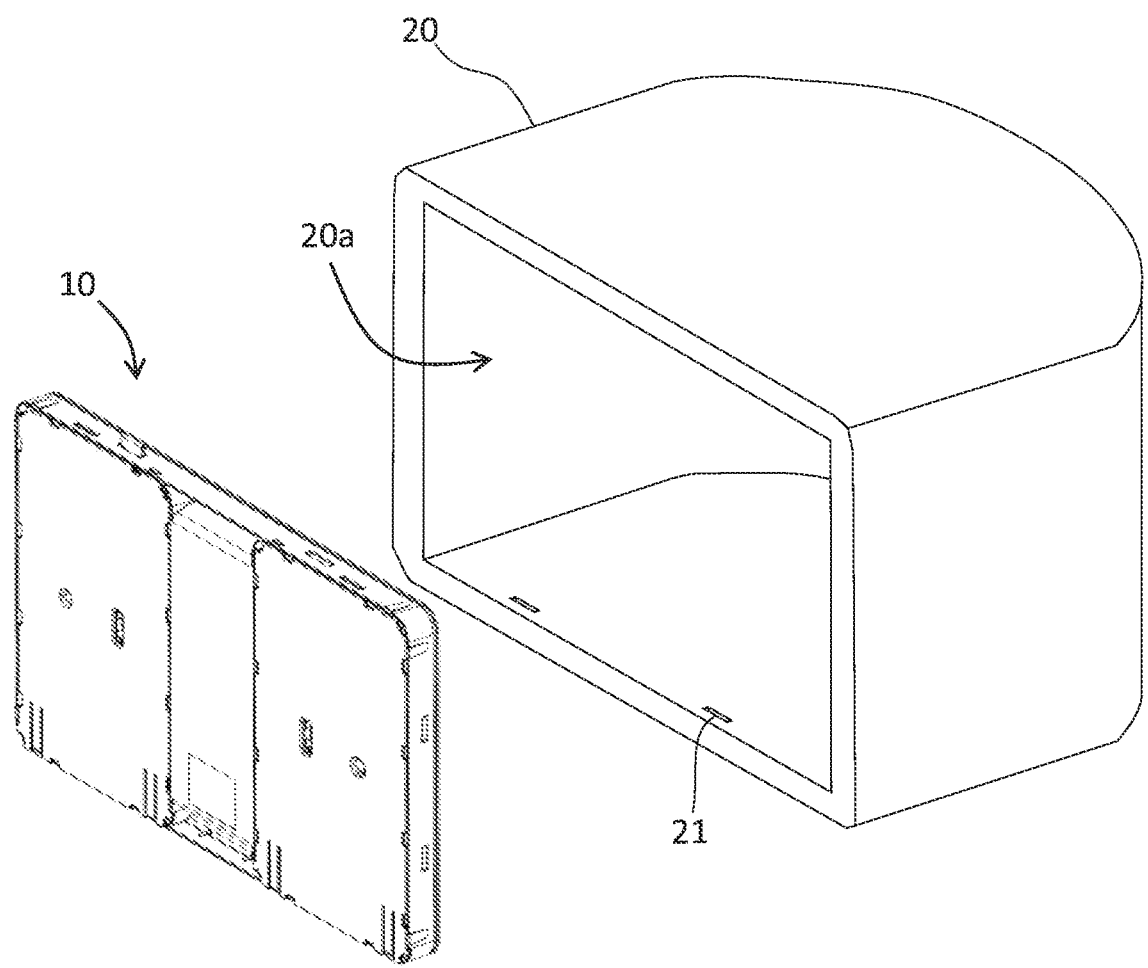
FIG. 1 is a schematic diagram of a semiconductor container according to one embodiment of the invention.
Figure 2:
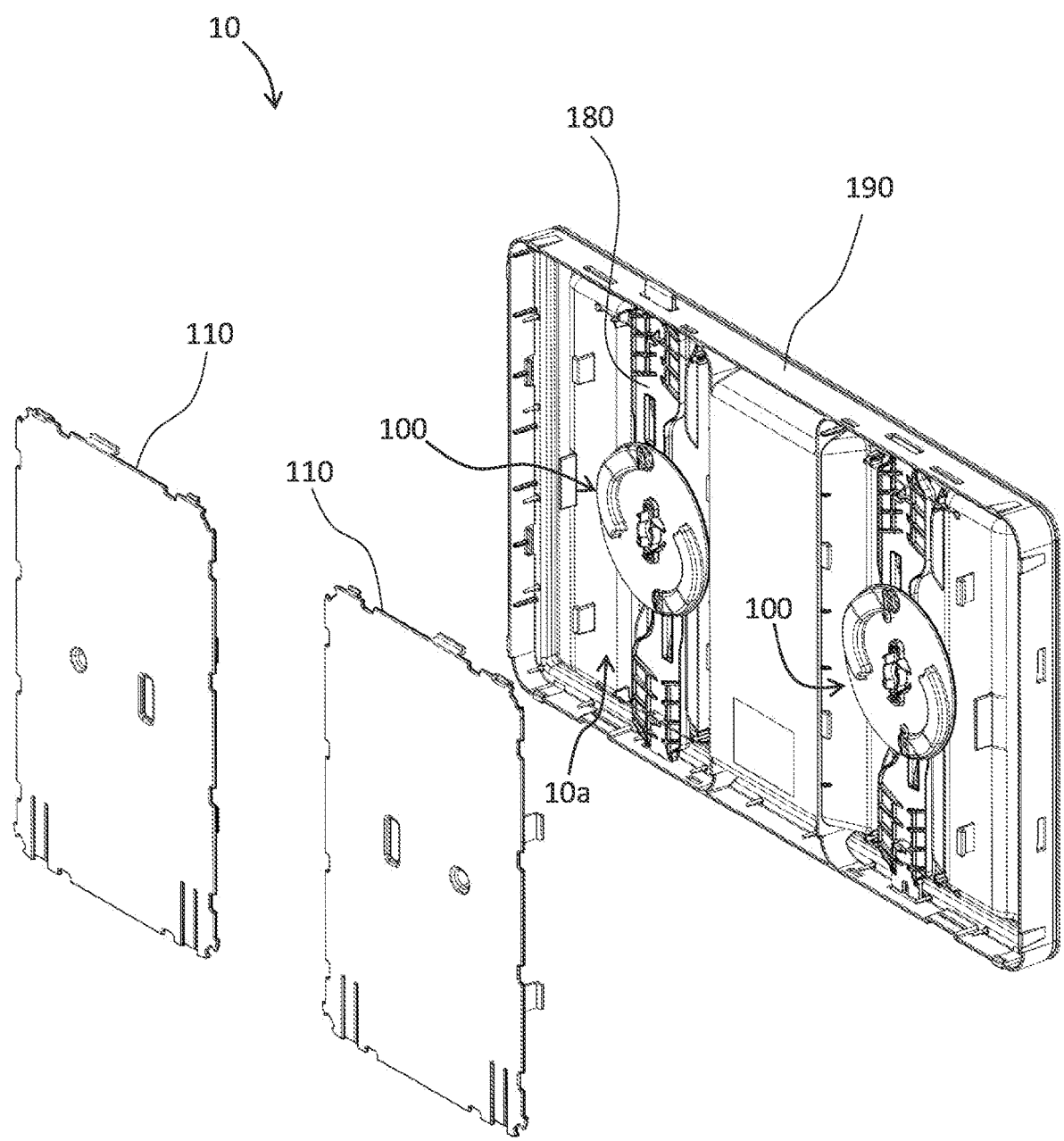
FIG. 2 is a schematic diagram of the internal structure of the door locking mechanism.
Figure 3:
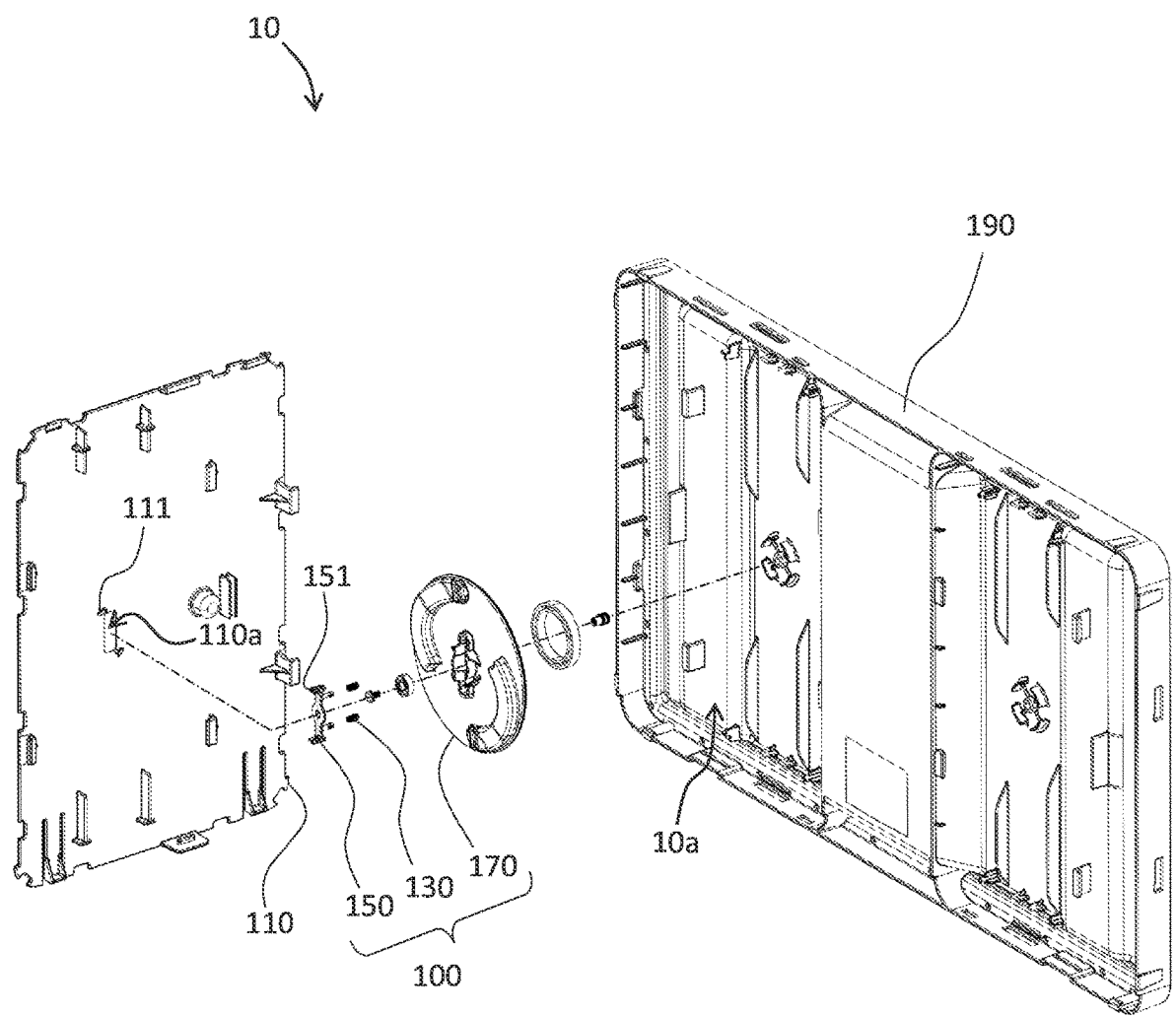
FIG. 3 is an exploded diagram of one door locking mechanism according to one embodiment of the invention.

Please refer to FIGS. 1-3 at the same time. FIG. 1 is a schematic diagram of a semiconductor container according to one embodiment of the invention. FIG. 2 is a schematic diagram of the internal structure of the door locking mechanism. FIG. 3 is an exploded diagram of one door locking mechanism according to one embodiment of the invention.

The semiconductor container 30 of the present embodiment includes a container body 20 and a door locking mechanism 10. The container body 20 has a containing space 20a for containing one or more semiconductor objects and a latching portion 21 disposed in the vicinity of the opening of the containing space 20a. The door locking mechanism 10 is configured to lock with the container body 20. A latching member 180 is provided in an accommodating space 10a defined by a door panel 110 and a cover 190, and the latching member 180 is connected to a locking module 100. In the present embodiment, there are two latching members 180 respectively arranged on two opposite sides of the locking module 100. The locking module 100 controls a locking and an unlocking operation of the latching member 180 in relation to the container body 20. In the unlocking operation, the latching member 180 moves inwardly and retracts away from the latching portion 21 of the container body 20 to form an unlocked state. In the locking operation, the latching member 180 moves outwardly and extends into the latching portion 21 to form a locked state. In this manner, the door locking mechanism 10 can be operated to close and open the containing space 20a. The number of the latching member 180 is not limited to two as described herein, it can be adjusted according to actual needs. The semiconductor object can be exemplified by but not limited to wafer, reticle, or other semiconductor substrates used in semiconductor processes. The semiconductor container 30 can be used to prevent moisture and particles from entering the containing space 20a, to keep the cleanliness, and to facilitate the transportation of the semiconductor objects.

The door locking mechanism 10 includes the door panel 110, the cover 190, and the locking module 100. The door panel 110 has a first stop structure 111. The cover 190 is used for assembling with the door panel 110 and defining the accommodating space 10a with the door panel 110. The locking module 100 is disposed in the accommodating space 10a. The door locking mechanism 10 is detachably locked with the container body 20 through the locking module 100 and its connecting latching member 180. The door locking mechanism 10 can be removed from the container body 20 as needed, and then the robotic arm can pick up the semiconductor objects (not shown in the drawings) contained in the semiconductor container 30. The door panel 110 has a lock hole 110a penetrating an upper and a lower surface of the door panel 110 for receiving the key. The first stop structure 111 is disposed at the periphery of the lock hole 110a. The locking module 100 and the latching member 180 of the present embodiment provide reliable locking, so the door locking mechanism 10 and the container body 20 can be firmly locked with each other. The key can correctly insert into the lock hole 110a and then drive the locking module 100 to open and close the door.

The locking module 100 of the present embodiment is disposed in the accommodating space 10a. The locking module 110 includes a rotating member 170, a holding member 150, and an elastic member 130. The holding member 150 is disposed on the rotating member 170 and has a second stop structure 151. The location of the second stop structure 151 corresponds to the location of the first stop structure 111. The elastic member 130 is disposed between the holding member 150 and the rotating member 170. The elastic member 130 is elastically compressed when a force is applied to the holding member 150, and the second stop structure 151 of the holding member 150 detaches from the limitation state with the first stop structure 111 for allowing the rotating operation of the rotating member 170. On the other hand, the elastic member 130 elastically restores when the force is removed from the holding member 150, and the second stop structure 151 returns to the limitation state with the first stop structure 111 for limiting the rotating operation of the rotating member 170.

In the present embodiment, the door locking mechanism 10 is exemplified by including a pair of locking modules 100 respectively arranged on the right and the left side in the door locking mechanism 10 as shown in FIG. 2. The two locking modules 100 have the same structure and include the same components. Only one locking module 100 is further detailed below to clearly show the features of the embodiments of the invention.

Figure 4:
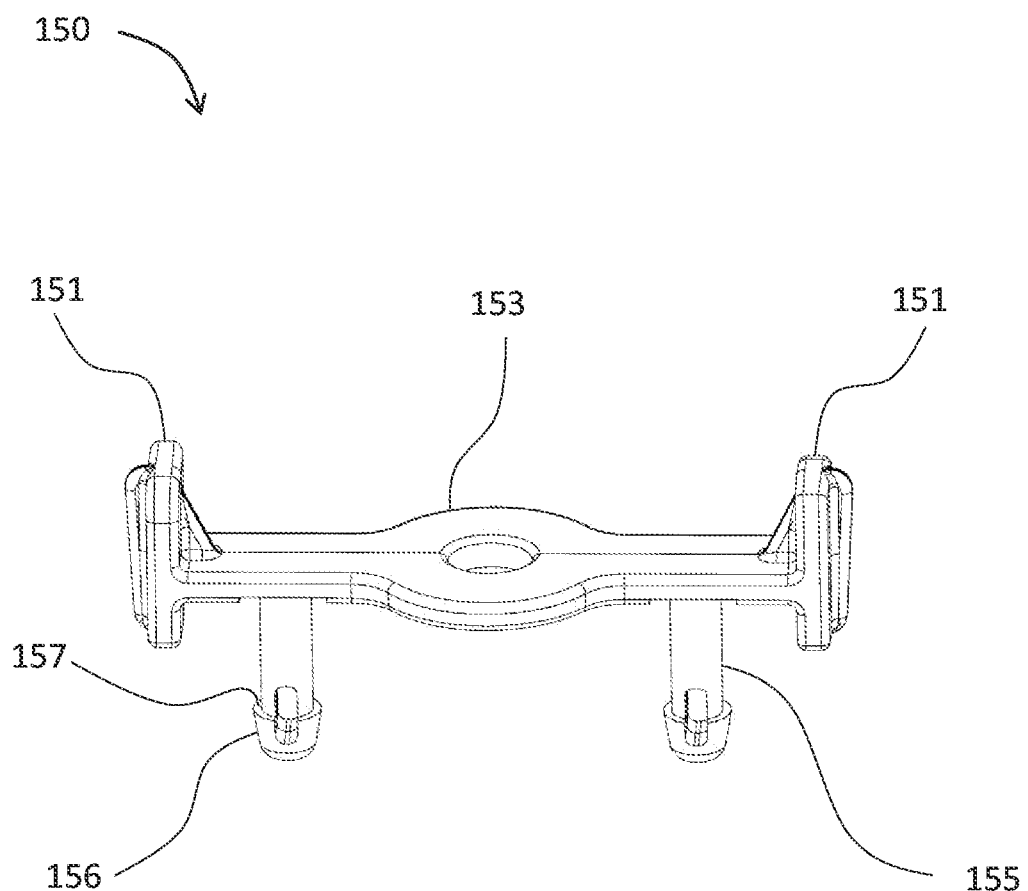
FIG. 4 is a three-dimensional diagram of the holding member according to one embodiment of the invention.

Please refer to FIGS. 3 & 4. FIG. 4 is a three-dimensional diagram of the holding member according to one embodiment of the invention.

The holding member 150 includes a main body 153 and an installation part 155 disposed on the main body 153. The second stop structure 151 connects to an end portion of the main body 153 and protrudes toward the door panel 110 (i.e. extending in the direction Z in FIG. 3 and FIG. 4). The second stop structure 151 can also be a part of the main body 153 that extends upwardly. The installation part 155 is used for installing the elastic member 130 and its protruding direction is opposite to that of the second stop structure 151, which means the installation part 155 protrudes away from the door panel 110. In the present embodiment, the main body 153 has a flat structure and its two end portions respectively connect to the two second stop structures 151. Each second stop structure 151 has an upright arm perpendicular to the main body 153. It should be noted that the size and shape of the second stop structure 151 are not limited to those shown in FIG. 4. Because the second stop structure 151 is intended to interfere with the first stop structure 111, any structural design with sufficient mechanical strength can be used in the holding member 150.

Figure 5:
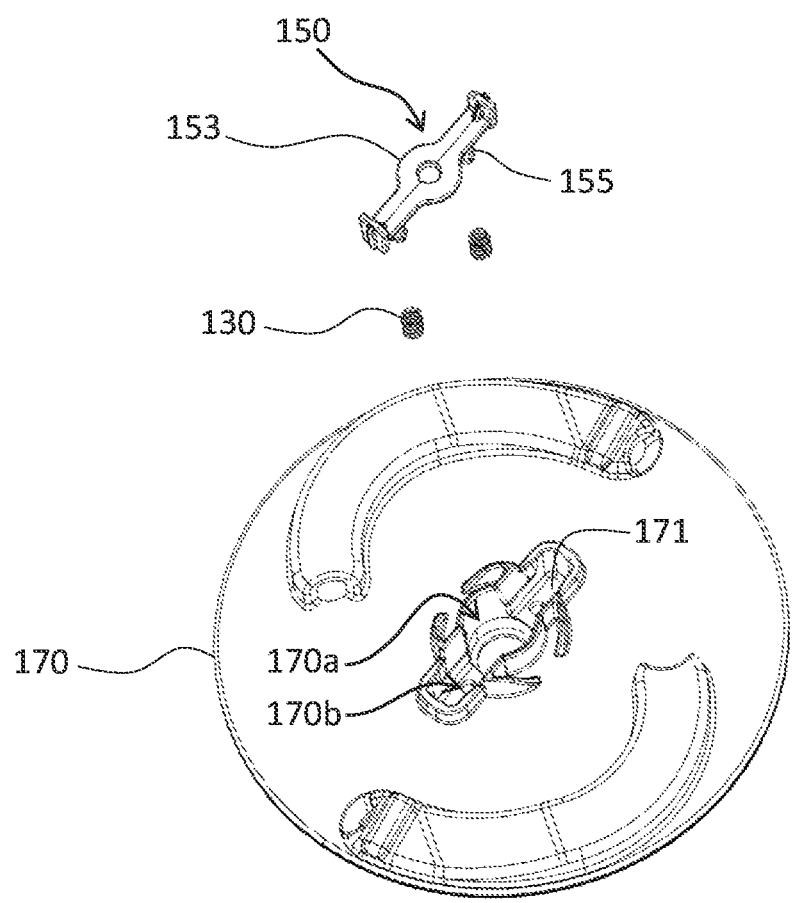
FIG. 5 is an exploded diagram of the locking module.
Figure 6:
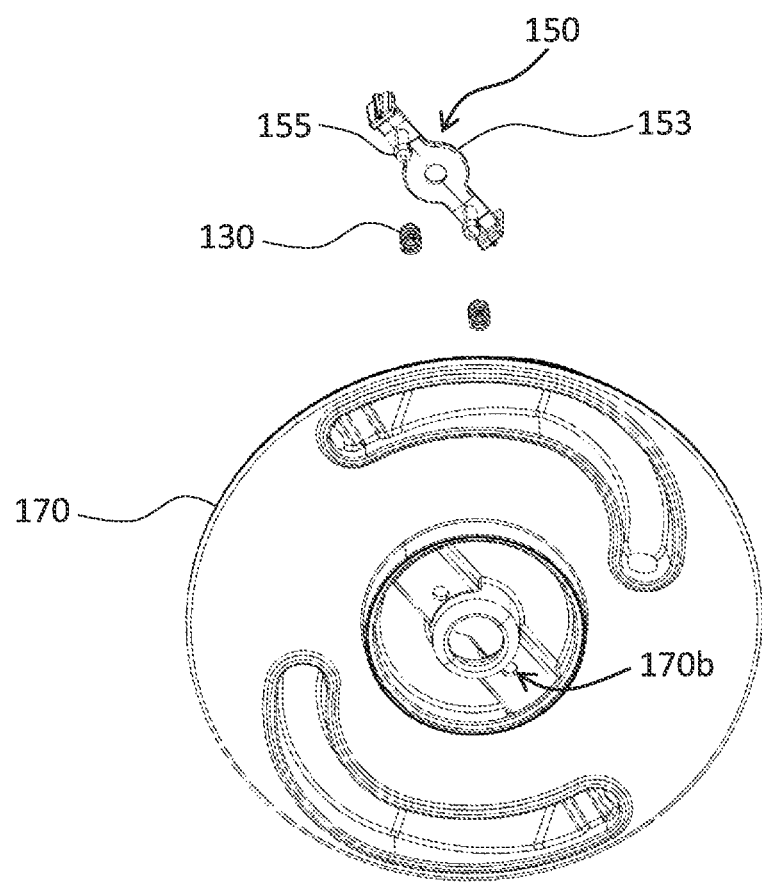
FIG. 6 is an exploded diagram of the locking module of FIG. 5 from another view angle.
Figure 7:
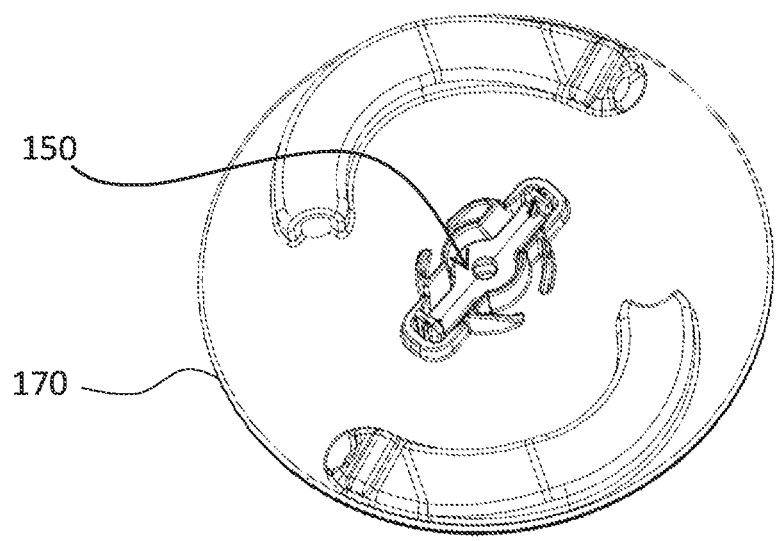
FIG. 7 is a schematic diagram showing the assembled locking module.
Figure 8:
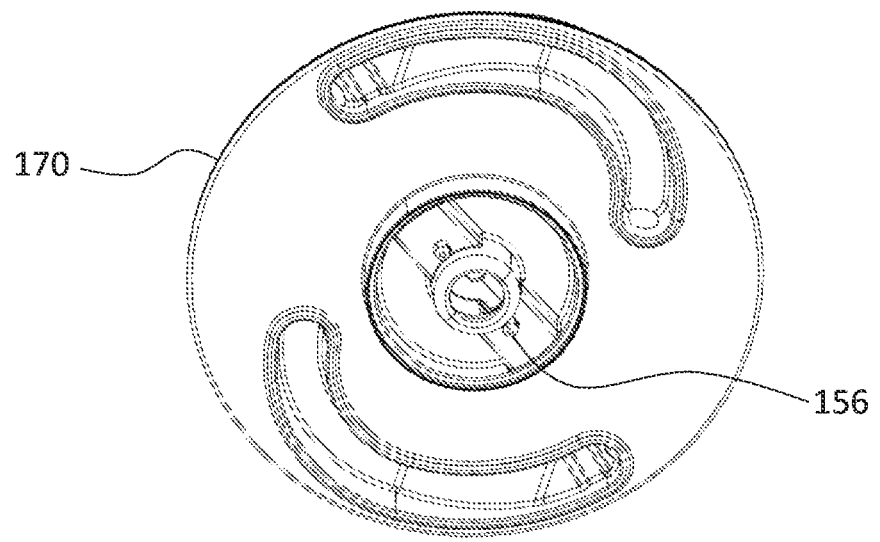
FIG. 8 is a schematic diagram of the locking module of FIG. 7 from another view angle.

Please refer to FIG. 4, and FIGS. 5-8. FIG. 5 is an exploded diagram of the locking module. FIG. 6 is an exploded diagram of the locking module of FIG. 5 from another view angle. FIG. 7 is a schematic diagram showing the assembled locking module. FIG. 8 is a schematic diagram of the locking module of FIG. 7 from another view angle.

The installation part 155 is disposed on the main body 153 and protrudes in the opposite direction as the second stop structure 151. The holding member 150 is movably disposed on the rotating member 170 through the installation part 155. The rotating member 170 includes an installation slot 170a for installing the holding member 150, and the installation slot 170a corresponds to the location of the lock hole 110a (lock hole 110a is shown in FIG. 3). The rotating member 170 further includes a penetrating hole 170b in the installation slot 170a. The main body 153 of the holding member 150 is disposed in the installation slot 170a, and a portion of the installation part 155 penetrates through the penetrating hole 170b. The elastic member 130 is disposed between a surface of the main body 153 and an inner bottom surface 171 of the installation slot 170a.

The elastic member 130 is sleeved over the installation part 155, and two ends of the elastic member 130 are respectively in contact with the surface of the main body 153 and the inner bottom surface 171 of the installation slot 170a. The elastic member 130 can be exemplified by a coil spring; however, other elastic elements that can be elastically compressed and elastically restore can be used herein.

Further about the holding member 150, one end of the installation part 155 has an elastic pin 156 which has a protruded edge 157. An outer diameter of the protruded edge 157 is larger than a diameter of the penetrating hole 170b, so the elastic pin 156 can penetrates through the penetrating hole 170b and then contact an outer bottom surface of the installation slot 170a. In this manner, the elastic pin 156 can be installed and removed from the installation slot 170a. When installing the installation part 155, the elastic pin 156 is first squeezed and then passes through the penetrating hole 170b. After passing through the penetrating hole 170b, the elastic pin 156 elastically restores and the protruded edge 157 contacts the outer bottom surface of the installation slot 170a. As a result, the holding member 150 is detachably installed onto the rotating member 170 through the elastic pin 156.

Figure 9:
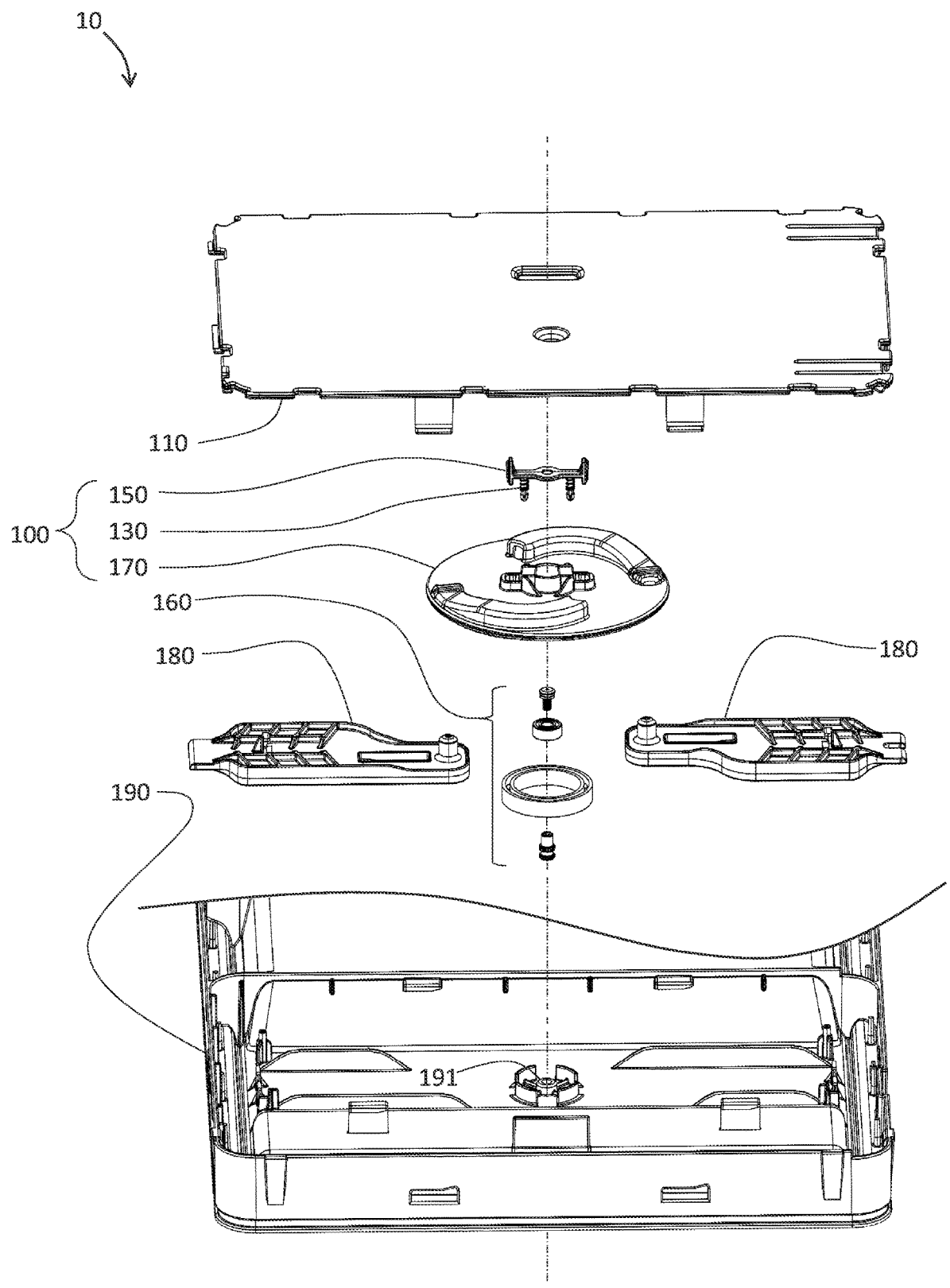
FIG. 9 is a partial exploded diagram of the door locking mechanism of FIG. 2.

The locking module 100 of the present embodiment of the invention will be more detailed below. Please refer to FIGS. 2 & 9. FIG. 9 is a partial exploded diagram of the door locking mechanism of FIG. 2.

The latching member 180 is provided in the accommodating space 10a of the door locking mechanism 10. The latching member 180 is connected to the locking module 100. The rotating member 170 of the locking module 100 controls the latching member 180 such that the latching member 180 can either move outwardly and protrude out of the cover 190 or move inwardly and contract into the cover 190, realizing the locking operation and unlocking operation of the latching member 180. Please refer to FIG. 1, in one embodiment, the latching member 180 can be moved back and forth between a locking position and a retracted position. When in the locking position, one end of the latching member 180 is extended and protruded to the latching portion 21 of the container body 20 and to be fitted into and locked with the latching portion 21. When in the contracted position, the end of the latching member 180 moves away and retreats from the latching portion 21, and the door locking mechanism 10 can be removed from the container body 20.

The door locking mechanism 10 of the present embodiment further includes an axial assembly 160, for rotatably connecting to the locking module 100. The cover 190 further includes a pivot base 191 for coupling with the axial assembly 160 so the locking module 100 can be mounted onto the axial assembly 160 for allowing a revolving operation of the locking module 100. More specifically, one side of the axial assembly 160 connects to the pivot base 191 and the other side connects to the rotating member 170 for rotatably connecting the locking module 100 to the cover 190.

The limitation state of the second stop structure 151 and the first stop structure 111 will be elaborated in more detail.

Figure 10:
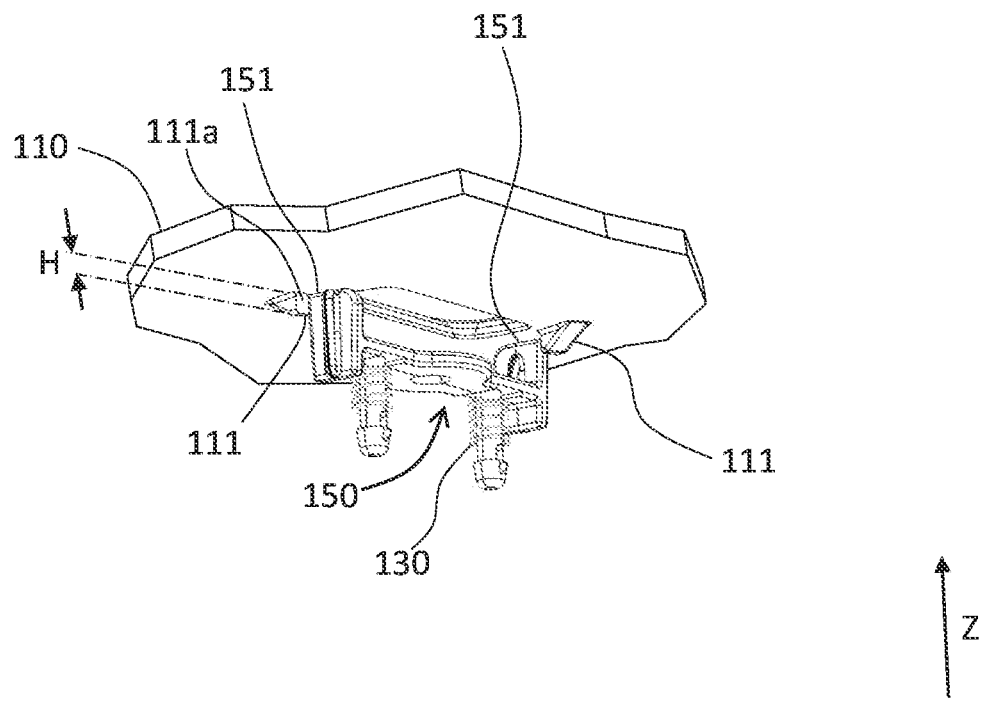
FIG. 10 is a schematic diagram showing the second stop structure and the first stop structure in the limitation state.
Figure 11:
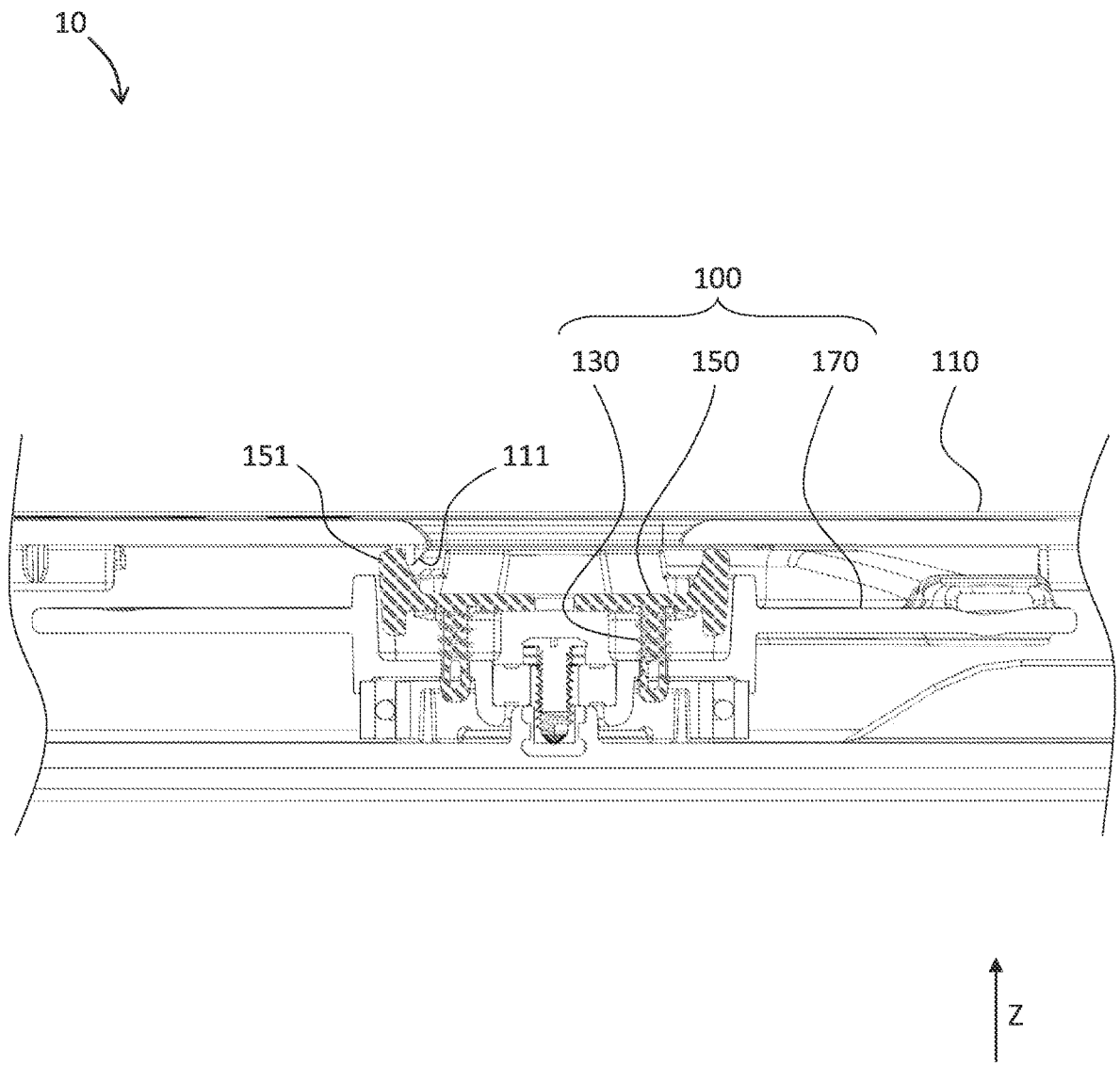
FIG. 11 is a cross-sectional diagram of the door locking mechanism according to one embodiment of the invention.
Figure 12:
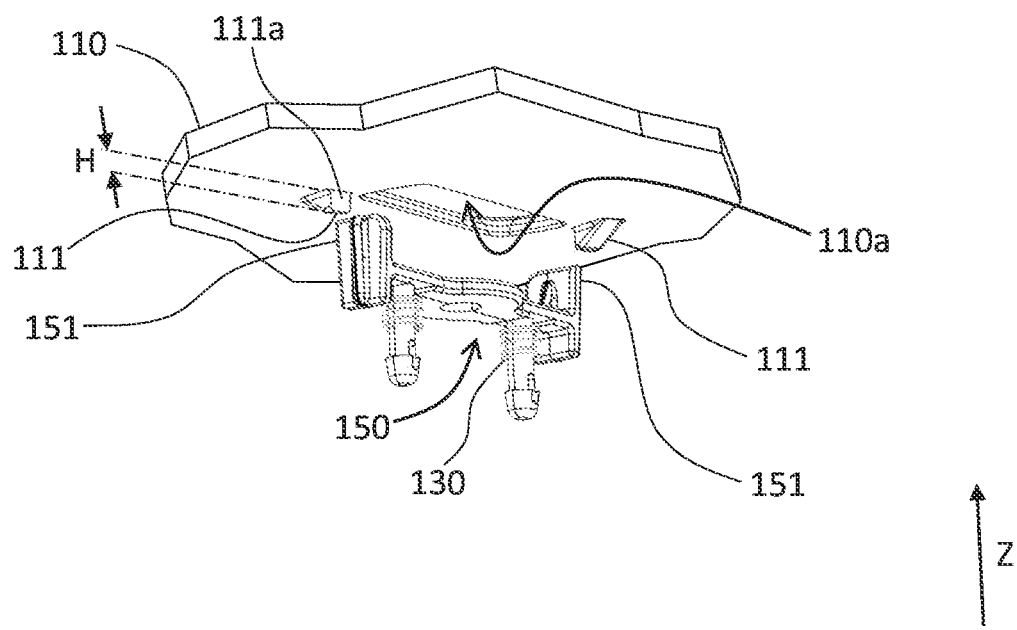
FIG. 12 is a schematic diagram showing the second stop structure detached from the limitation state with the first stop structure.
Figure 13:
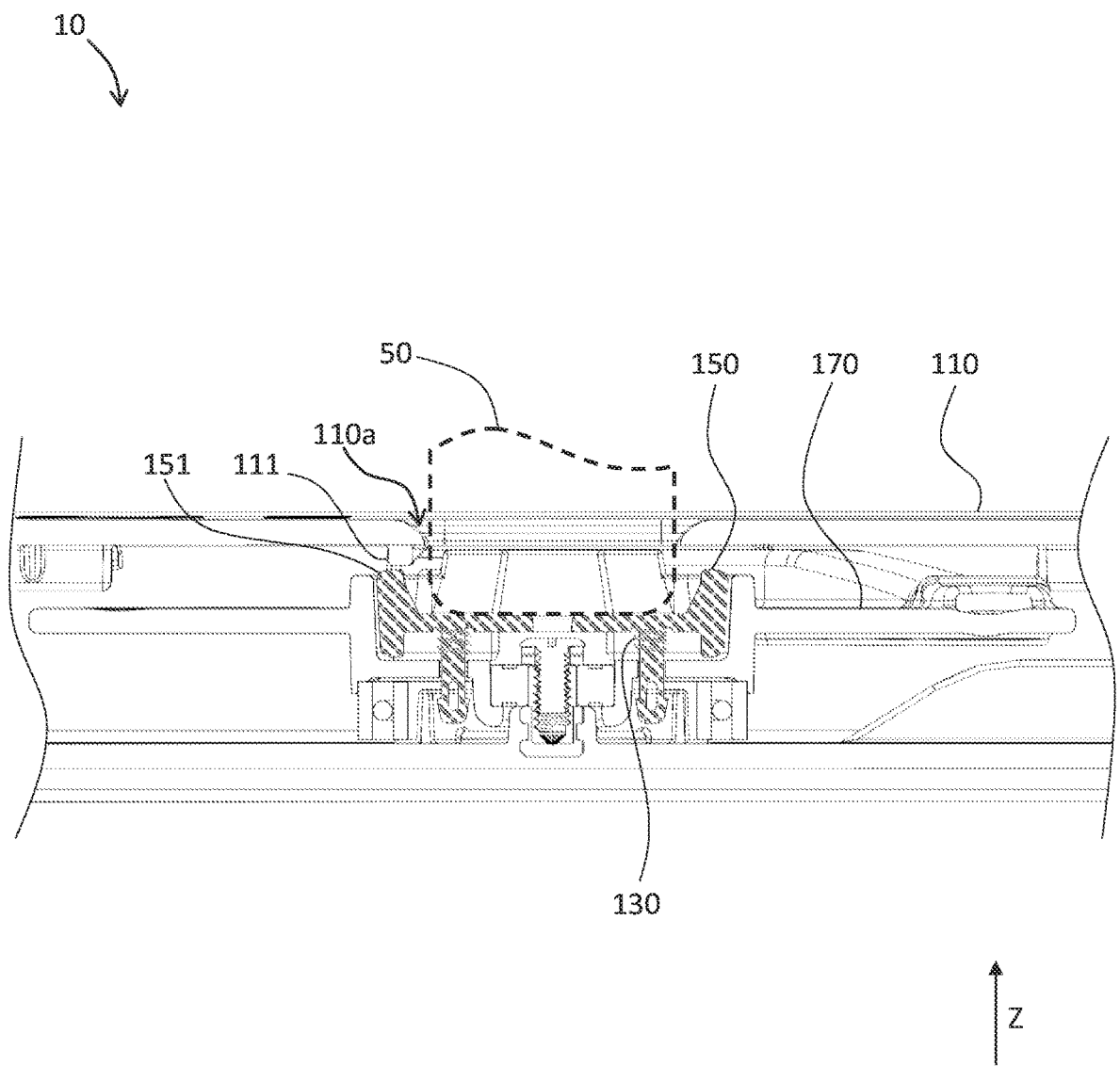
FIG. 13 is a schematic diagram showing the holding member being pushed from the door panel by a distance.

Please refer to FIGS. 10-13. FIG. 10 is a schematic diagram showing the second stop structure and the first stop structure in the limitation state. FIG. 11 is a cross-sectional diagram of the door locking mechanism according to one embodiment of the invention. FIG. 12 is a schematic diagram showing the second stop structure detached from the limitation state with the first stop structure. FIG. 13 is a schematic diagram showing the holding member being pushed from the door panel by a distance.

When the holding member 150 is not applied by the force, the elastic member 130 elastically restores its state, as shown in FIGS. 10 & 11. Since the elastic member 130 is disposed between the rotating member 170 and the holding member 150, the elastic member 130 elastically holds the holding member 150 in the location adjacent to the door panel 110. The second stop structure 151 is hence limited by the first stop structure 111. The rotating operation of the rotating member 170 is therefore limited. In the present embodiment, the first stop structure 111 can be exemplified by one or more blocks protruding from the surface of the door panel 110 by a height H. The first stop structure 111 has an abutting surface 111a. The second stop structure 151 presses against the abutting surface 111a to limit its rotational movement. More specifically, the blocks of the first stop structure 111 are respectively disposed in the locations where the rotation of the second stop structure 151 can be interfered and blocked.

As shown in FIGS. 12 & 13, when the holding member 150 is pushed away from the door panel 110 by the force in a direction opposite to the direction Z, and when its travel distance is greater than the height H of the blocks, the elastic member 130 is elastically compressed and the second stop structure 151 detaches from the limitation state with the first stop structure 111. Now the holding member 150 and the rotating member 170 connecting therewith can be controlled to perform the rotating operation, without the interference by the first stop structure 111. In practice, when the key 50 (or the end effector on robotic arm) inserts into the lock hole 110a and pushes the holding member 150 away from the door panel 110 in the direction opposite to the direction Z, the second stop structure 151 detaches from the first stop structure 111 and therefore is not in the limitation state. The rotating member 170 can now be driven to rotate by the key 50. The elastic member 130 is elastically compressed and stores potential energy. When the key 50 is removed from the lock hole 110a, the elastic member 130 restores its position and pushes the holding member 150 back to the location adjacent to the door panel 110. The second stop structure 151 and the first stop structure 111 now return to the limitation state as shown in FIGS. 10 & 11.

According to the above-mentioned embodiments of the invention, in the door locking mechanism and the semiconductor container using the same, the second stop structure of the holding member and the first stop structure of the door panel are in the limitation state to limit the rotation or movement of the rotating member and to hold the position of the rotating member. The unexpected movement or accidental rotation of the rotating member caused by vibrations during transporting the container or during the semiconductor fabrication process can be prevented. The key can be inserted correctly, and the problem that the robotic arm cannot open and close the door correctly due to keyhole misalignment can be solved. Also, the problem of the door accidentally falling off the container can be prevented.

The ordinal numbers used in the detailed description and claims, such as "first" and "second" do not necessarily indicate their priority orders or up and down directions; on the contrary, they are merely intended to distinguish different members. It will be apparent to those skilled in the art that various modifications and variations can be made to the structure of the present invention without departing from the scope or spirit of the invention. In view of the foregoing, it is intended that the present invention covers modifications and variations of this invention, provided they fall within the scope of the following claims.

What is claimed is:

1. A door locking mechanism for using in a semiconductor container, the door locking mechanism comprising:
   a door panel having a first stop structure;
   a cover for assembling with the door panel and defining an accommodating space therewith; and
   a locking module disposed in the accommodating space, the locking module comprising:
      a rotating member;
      a holding member disposed on the rotating member, the holding member having a second stop structure corresponding to a location of the first stop structure; and
      an elastic member disposed between the holding member and the rotating member, wherein the elastic member is elastically compressed when a force is applied to the holding member, and the second stop structure of the holding member detaches from a limitation state with the first stop structure for allowing a rotating operation of the rotating member; whereas, the elastic member elastically restores when the force is removed from the holding member, and the second stop structure returns to the limitation state with the first stop structure for limiting the rotating operation of the rotating member.

2. The door locking mechanism according to claim 1, wherein the door panel has a lock hole penetrating an upper surface and a lower surface of the door panel, and the first stop structure is disposed at the periphery of the lock hole.

3. The door locking mechanism according to claim 2, wherein the rotating member comprises an installation slot for installing the holding member, and the installation slot corresponds to a location of the lock hole.

4. The door locking mechanism according to claim 1, wherein the holding member comprises a main body and an installation part disposed on the main body, the second stop structure connects to an end portion of the main body and protrudes toward the door panel, and the installation part is used for installing the elastic member and protrudes away from the door panel.

5. The door locking mechanism according to claim 4, wherein the rotating member comprises an installation slot and a penetrating hole in the installation slot, the main body of the holding member is disposed in the installation slot, a portion of the installation part is installed in the penetrating hole, and the elastic member is disposed between a surface of the main body and an inner bottom surface of the installation slot.

6. The door locking mechanism according to claim 5, wherein one end of the installation part has an elastic pin which has a protruded edge, and an outer diameter of the protruded edge is larger than a diameter of the penetrating hole so the elastic pin penetrates through the penetrating hole and is in contact with an outer bottom surface of the installation slot, whereby the elastic pin is used for installing to and removing from the installation slot.

7. The door locking mechanism according to claim 1, wherein a latching member connecting to the locking module is provided in the accommodating space, and the rotating member of the locking module controls a locking operation and an unlocking operation of the latching member in relation to a container body.

8. The door locking mechanism according to claim 1, wherein the cover further comprises a pivot base for coupling with the locking module for allowing a revolving operation of the locking module.

9. A semiconductor container, comprising:
a container body having a containing space for containing one or more semiconductor objects and a latching portion disposed in the vicinity of an opening of the containing space; and
a door locking mechanism configured to lock with the container body, the door locking mechanism comprising:
a door panel having a first stop structure;
a cover for assembling with the door panel and defining an accommodating space therewith;
a locking module disposed in the accommodating space, the locking module comprising:
a rotating member;
a holding member disposed on the rotating member, the holding member having a second stop structure corresponding to a location of the first stop structure; and
an elastic member disposed between the holding member and the rotating member, wherein the elastic member is elastically compressed when a force is applied to the holding member, and the second stop structure of the holding member detaches from a limitation state with the first stop structure for allowing a rotating operation of the rotating member; whereas, the elastic member elastically restores when the force is removed from the holding member, and the second stop structure returns to the limitation state with the first stop structure for limiting the rotating operation of the rotating member; and
a latching member disposed in the accommodating space and connected to the locking module, wherein the locking module controls a locking operation and an unlocking operation of the latching member in relation to the container body, thereby controlling the door locking mechanism to close and open the containing space.

* * * * *